United States Patent [19]

Goto

[11] 4,167,708

[45] Sep. 11, 1979

[54] TRANSISTOR AMPLIFIER

[75] Inventor: Motoomi Goto, Hamamatsu, Japan

[73] Assignee: Nippon Gakki Seizo Kabushiki Kaisha, Hamamatsu, Japan

[21] Appl. No.: 884,215

[22] Filed: Mar. 7, 1978

[30] Foreign Application Priority Data

Mar. 10, 1977 [JP] Japan ............................ 52/28946[U]

[51] Int. Cl.² .............................................. H03F 3/18
[52] U.S. Cl. .................................... 330/263; 330/266; 330/267
[58] Field of Search ............... 330/263, 267, 268, 273, 330/264, 274, 289, 296; 330/265, 266

[56] References Cited
U.S. PATENT DOCUMENTS 4,015,212  3/1977  Miyata .................................. 330/264

Primary Examiner—Lawrence J. Dahl
Attorney, Agent, or Firm—Cushman, Darby & Cushman

[57] ABSTRACT

A transistor amplifier comprises an input stage circuit and an output stage circuit direct-coupled to the input stage circuit: the input stage including complimentary paired transistors having bases commonly connected to an input terminal and emitters AC-wise grounded and further connected to constant current sources, respectively; the output stage being a single-ended push-pull amplifier circuit including complimentary paired transistors having bases connected to collectors of the input stage transistors, respectively, and emitters commonly connected to an output terminal. This transistor amplifier has advantages that it is simple in arrangement and that both its DC and AC operations are highly stabilized against variations in the ambient temperature and in the voltages of operating power supplies.

3 Claims, 3 Drawing Figures

TRANSISTOR AMPLIFIER

BACKGROUND OF THE INVENTION (a) Field of the invention:

The present invention pertains to a transistor amplifier employing a plurality of transistors serving at its amplifying elements, and more particularly it pertains to a multi-stage transistor amplifier of a full stage direct-coupled configuration.

(b) Description of the prior art:

Currently known transistor amplifiers almost invariably adopt the full stage direct-coupled configuration. With such a configuration, it is most important to stabilize the quiescent operating point for each amplifying transistor in the respective stage circuits, particularly in the input stage circuit in order to obtain a good over-all operation stability of the amplifier.

To meet the above requirement, most of the conventional transistor amplifiers according to the prior art are so arranged that their input circuit and/or the subsequent stage circuits are comprised of a differential amplifiers, respectively, of which operation is, as well known, hardly affected by fluctuations in the ambient temperature and in the voltages of the operating power supplies, and/or that there are provided circuit means such as for making compensation for those variations of the quiescent operating point for each amplifying transistor in the respective stage circuits which might be caused by the changes in the ambient temperature and in the voltages of the operating power supplies. As such, the prior art transistor amplifiers have tended to be complicated in their structure.

SUMMARY OF THE INVENTION

It is, therefore, an object of the present invention to provide a transistor amplifier which is simple in arrangement, and the operation of which is hardly affected by variations in the ambient temperature and in the voltages of the operating power supplies.

Another object of the present invention is to provide a transistor amplifier of the type described, in which the quiescent operating point for each amplifying transistor employed in the amplifier is stabilized against variations in the ambient temperature and in the voltages of the operating power supplies.

Still another object of the present invention is to provide a transistor amplifier which is suitable for use as the input stage circuit of a multi-stage transistor amplifier of full stage direct-coupled configuration.

According to one aspect of the present invention, there is provided a transistor amplifier comprising: an input stage circuit including a first and a second transistor which are complementary to each other and are connected together at their bases to an input terminal of the transistor amplifier, the emitters of the first and second transistors being connected to constant current sources, respectively, and grounded through capacitors, respectively, the collectors of the first and second transistors being connected to constant potential lines, respectively; and an output stage circuit which is direct-coupled to the input stage circuit and is comprised of a single-ended push-pull amplifier circuit including as amplifying elements a third transistor and a fourth transistor which are complementary to each other, the bases of the third and fourth transistors being direct-coupled to the corresponding ones of the collectors of the first and second transistors, respectively.

These and other objects as well as the features and the advantages of the present invention will become apparent by reading the following detailed description of the preferred embodiments of the present invention when taken in conjunction with the accompanying drawings.

BRIEF DESCRIPTION OF THE DRAWINGS

Like parts are indicated by like reference symbols throughout the drawings.

DETAILED DESCRIPTION OF THE PREFERRED EMBODIMENTS

Figure 1:
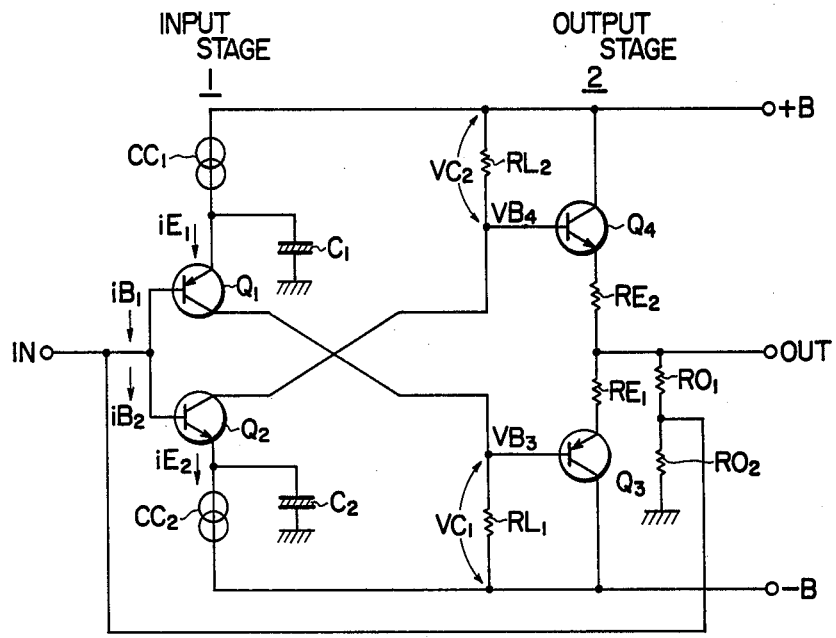
FIG. 1 is an electric circuit diagram, showing an example of the transistor amplifier embodying the present invention.

In FIG. 1 is shown diagrammatically an example of two-stage transistor amplifier according to the present invention, which is composed of an input stage circuit and an output stage circuit.

The input stage circuit includes a pnp transistor $Q_1$ and an npn transistor $Q_2$. The two transistors $Q_1$ and $Q_2$ are coupled to each other in common at their bases which, in turn, are connected to an input terminal IN of the transistor amplifier. The emitters of the transistors $Q_1$ and $Q_2$ are connected to constant current sources, respectively, containing constant current circuits $CC_1$ and $CC_2$ and through said constant current sources the emitters are connected to operating power supply lines $+B$ and $-B$, respectively, to which are applied the voltages of the positive and negative operating power supplies, respectively. The emitters of those transistors $Q_1$ and $Q_2$ are also grounded through capacitors $C_1$ and $C_2$, respectively. The collectors of the transistors $Q_1$ and $Q_2$ are connected to constant potential lines which in this example are the negative and the positive operating power supply lines $-B$ and $+B$ and which contain load resistors $RL_1$ and $RL_2$, respectively.

The output stage circuit is comprised of a single-ended push-pull amplifier circuit including a pnp transistor $Q_3$ and an npn transistor $Q_4$. The transistors $Q_3$ and $Q_4$ have their collectors connected to the operating power supply lines $-B$ and $+B$, respectively, and have their emitters connected in common through resistors $RE_1$ and $RE_2$ and further connected to an output terminal OUT of the transistor amplifier. The bases of the transistors $Q_3$ and $Q_4$ are direct-coupled to the collectors of the transistors $Q_1$ and $Q_2$, respectively, of the input stage circuit. The output terminal OUT is connected back to the input terminal IN through a voltage divider network composed of resistors $RO_1$ and $RO_2$. The AC operation of the transistor amplifier described above is as follows: signals applied at the input terminal IN are first amplified as well as phase-inverted by the input circuit to be delivered out at the collectors of the respective transistors $Q_1$ and $Q_2$. It should be noted that the capacitors $C_1$ and $C_2$ are so selected as will offer no or negligible impedance against the input signal frequencies evaluated for amplification. Therefore, the input stage circuit will provide a large voltage gain for the input signals. The transistors $Q_3$ and $Q_4$ of the output state circuit are driven by the amplified input signals on the corresponding ones of the collectors of the transistors $Q_1$ and $Q_2$, respectively. Thus, at the output terminal OUT are delivered out the input signals which have been amplified by both of the input and output stage circuits. The output signals at the output terminal OUT are partially fed back to the input stage circuit through the voltage divider network.

Description will hereunder be made in detail on the DC operation of the above-mentioned transistor amplifier shown in FIG. 1.

The emitter DC currents $ie_1$ and $ie_2$ supplied to the emitters of the transistors $Q_1$ and $Q_2$ are stabilized at constant values by the constant current circuits $CC_1$ and $CC_2$. Accordingly, voltage drops $VC_1$ and $VC_2$ developed across the load resistors $RL_1$ and $RL_2$ will remain constant, so that the potentials at both bases of the transistors $Q_3$ and $Q_4$ as well as the voltages between the collectors and emitters of the transistors $Q_1$ and $Q_2$ will be kept constant, provided that the operating power supply lines $+B$ and $-B$ are held at constant potentials, respectively. The changes in the voltage of the operating power supplies applied to these lines $+B$ and $-B$ might cause some variations in the biasing conditions for the transistors $Q_3$ and $Q_4$, but such changes will hardly affect the biasing conditions for the transistors $Q_1$ and $Q_2$. Thus, the quiescent operating points for the respective transistors $Q_1$, $Q_2$, $Q_3$ and $Q_4$ are stabilized against variations in the ambient temperature and in the voltages of the operating power supplies. Furthermore, the transistor amplifier shown in FIG. 1 is arranged so that the output terminal OUT is connected back to the input terminal IN in order to further enhance the stability of the biasing conditions. In case there occur fluctuations in the biasing conditions for the transistors $Q_1$ and $Q_2$, such fluctuations are detected by the output stage circuit and they are fed back to the input stage circuit, whereby suppressing those fluctuations.

The DC operating conditions of the present invention transistor amplifier are stable irrespective of the variations in the ambient temperature as well as in the voltages of the operating power supplies as described above, so that the AC operation characteristics such as the gain and frequency response are also stabilized.

Figure 2:
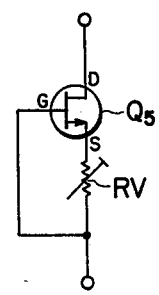
FIG. 2 is an electric circuit diagram, showing an example of the constant current circuit employed in the amplifier shown in FIG. 1.

An input offset current of the transistor amplifier shown in FIG. 1 corresponds to the difference between the base currents $iB_1$ and $iB_2$ of the transistors $Q_1$ and $Q_2$ when the input terminal IN is at zero volt, and will cause an input offset voltage. If the base currents $iB_1$ and $iB_2$ are same, then the input offset current as well as the input offset voltage will become nil. such conditions can be attained by properly determining the values of the emitter currents $iE_1$ and $iE_2$. FIG. 2 diagrammatically shows an example of arrangement of the constant current circuit $CC_1$ (or $CC_2$) shown in FIG. 1, which is comprised of an n-channel field effect transistor $Q_5$ having a drain D, a source S and a gate G which is connected to the source S via a variable resistor RV. When this constant current circuit is employed as the circuit $CC_1$ (or $CC_2$) shown in FIG. 1, the drain D and the junction of the gate G with the resistor RV are connected to the line $+B$ (or the emitter of the transistor $Q_2$) and the emitter of the transistor $Q_1$ (or the line $-B$), respectively. The zero setting for both the input offset current and voltage can be easily accomplished by adjusting the resistance values of variable resistors RV in the constant current circuits $CC_1$ and $CC_2$ to meet the above-mentioned requirement.

Figure 3:
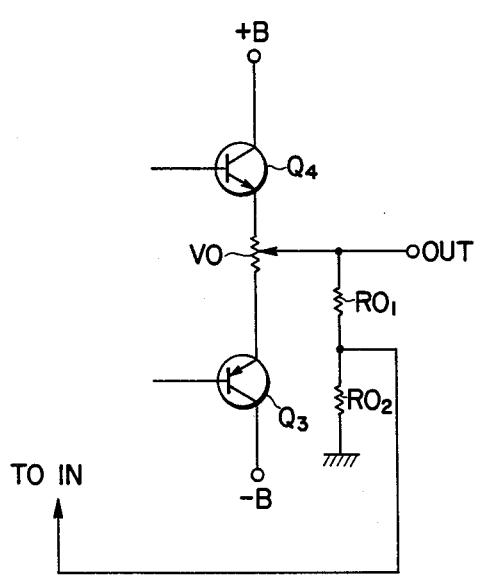
FIG. 3 is an electric circuit diagram, showing a modification of an output stage in the transistor amplifier of FIG. 1.

The output offset voltage at the terminal OUT can be adjusted to be zero volt by appropriately determining the resistance ratio between both resistors $RE_1$ and $RE_2$. To easily accomplish the zero setting for the output offset voltage, the arrangement of the output stage circuit may preferably be modified as shown in FIG. 3. In this Figure, the emitters of the transistors $Q_3$ and $Q_4$ are connected in common through an intervening potentiometer VO in place of the resistors $RE_1$ and $RE_2$ in FIG. 1, the output terminal OUT being led out from the slider tap of the potentiometer VO. The above zero setting can be accomplished by a mere adjustment of the position of the slider tap.

What is claimed is:

1. A transistor amplifier comprising:
    a first transistor of pnp type having a base, a collector connected through a resistor to a negative potential line, and an emitter grounded through a capacitor and connected through a constant current source to a positive potential line;
    a second transistor of npn type having a base coupled to the base of said first transistor and connected to an input terminal of said transistor amplifier, a collector connected through a resistor to said positive potential line, and an emitter grounded through a capacitor and connected through a constant current source to said negative potential line;
    a third transistor of pnp type having a base connected to the collector of said first transistor, a collector connected to an appropriate negative potential line, and an emitter connected to an output terminal of said transistor amplifier; and
    a fourth transistor of npn type having a base connected to the collector of said second transistor, a collector connected to an appropriate positive potential line, and an emitter connected to said output terminal.

2. A transistor amplifier according to claim 1, further comprising: a resistor network for coupling said output terminal to said input terminal.

3. A transistor amplifier according to claim 2, in which: the emitters of said third and second transistors are connected together via a potentiometer having a slider tap which is connected to said output terminal.

* * * * *